United States Patent [19]

Drinkwine

[11] Patent Number: 4,853,098

[45] Date of Patent: Aug. 1, 1989

[54] METHOD OF MAKING IMAGE INTENSIFIER TUBE

[75] Inventor: Monte J. Drinkwine, Lake Zurich, Ill.

[73] Assignee: ITT Electro Optical Products, A Division of ITT Corporation, Roanoke, Va.

[21] Appl. No.: 134,289

[22] Filed: Dec. 17, 1987

Related U.S. Application Data

[60] Division of Ser. No. 899,768, Aug. 22, 1986, Pat. No. 4,724,357, which is a continuation of Ser. No. 655,399, Sep. 27, 1984, abandoned.

[51] Int. Cl.[4] .............................................. C23C 14/34

[52] U.S. Cl. .......................... 204/192.28; 204/192.26; 204/192.15

[58] Field of Search ...................... 204/192.15, 192.17, 204/192.21, 192.22, 192.26, 192.27, 192.28, 192.29; 427/164, 165, 58, 126.3; 313/524, 525

[56] References Cited

U.S. PATENT DOCUMENTS

| | | | |
|---|---|---|---|
| 3,928,160 | 12/1975 | Nobutoki | 204/192.26 |
| 4,322,276 | 3/1982 | Meckel et al. | 204/192.2 XR |
| 4,404,263 | 9/1983 | Hodes et al. | 204/192.15 XR |

*Primary Examiner*—Nam X. Nguyen
*Attorney, Agent, or Firm*—Robert A. Walsh; Thomas N. Twomey; Mary C. Werner

[57] ABSTRACT

An image intensifier tube and a method of making same are disclosed wherein veiling glare caused by the amplification of off axis light is reduced. Included is a non-reflective, near infrared light absorbing first layer formed on the face plate of the tube adjacent any surface at which off-axis light could otherwise be reflected to the photoemissive device associated with the face plate and an electronically conductive second layer formed on top of the first layer. Such coatings are preferably formed by sputter deposition.

3 Claims, 2 Drawing Sheets

METHOD OF MAKING IMAGE INTENSIFIER TUBE

This application is a division of application Ser. No. 899,768, filed Aug. 22, 1986 now U S. Pat. No. 4,724,357 which is a continuation of Ser. No. 655,399, filed Sept. 27, 1984, now abandoned.

BACKGROUND OF THE INVENTION

This invention relates to image intensifier tubes of the type used in night vision viewing systems and, more particularly, to an image intensifier tube with reduced veiling glare and a method of making the same.

Image intensifier tubes multiply the amount of incident light they receive and thus provide an increase in light output which can be supplied either to a camera or directly to the eyes of a viewer. These devices are particularly useful for providing images from dark regions and have both industrial and military application. For example, these devices are used for enhancing the night vision of aviators, for photographing extraterrestial bodies, and for providing night vision to sufferers of retinitis pigmentosa (night blindness).

Modern image intensifier tubes utilize a micro-channel plate (referred to as an MCP) which is a thin glass plate having an array of microscopic holes through it. Each hole is capable of acting as a channel-type secondary emission electron multiplier. When the micro-channel plate is placed in the plane of an electron image in an intensifier tube, one can achieve a gain of up to ten to twenty thousand and extremely high resolution. Since each channel in a micro-channel plate operates nearly independently of all the others, a bright point source of light will saturate a few channels but will not spread out over adjacent areas. This characteristic of "local saturation" makes these tubes more immune to blooming at bright areas. However, these tubes suffer from a problem known as "veiling glare". Veiling glare is the result of scattered light falling on the light input or focal plane of the tube. In the image intensifier it results in a loss of contrast by filling in the darker portions of the image and decreasing the visibility of small or low contrast objects. In fact, in extreme cases it can cause a complete loss of picture information over a substantial part of the field of view.

Veiling glare is due primarily to off-axis light which is reflected into the inside of the tube and is intensified to appear in the field of view as unwanted images. The sources of veiling glare include bright light rays which enter the normal field of view at off-axis angles. The light rays originating from sources outside normal field of view are reflected at the interface of the face plate and the metal conductive layer to the photoemissive material of the tube resulting in emission from the latter to the image focused onto the photoemissive material to cause the unwanted veiling glare.

There have been various attempts to eliminate or reduce the veiling glare by adding material to the tube which absorbs off-axis light and prevents it from being reflected to the photoemissive layer. For example, black rings have been formed on the surface reflecting the off-axis light. These rings have been retained in place by sealing a glass ring to the surface or by fusing a glass ring to the surface to sandwich the ring in between the reflecting surface and the glass ring. This has been difficult to do and is very expensive. Another technique has been to etch a groove between the light input surface and the reflecting surface and to fill the groove with light absorbing material. This too has been difficult to do and is also very expensive. It is, therefore, an object Of the present invention to provide a light image intensifier tube with reduced veiling glare which is economical to make. It is a further object of this invention to provide a method of making such a tube in a highly economical and efficient manner.

SUMMARY OF THE INVENTION

An image intensifier tube is formed with a face plate made of optical material for transmitting light and with photoemissive means for emitting electrons in response to the light transmitted therethrough. In making the tube, there is included the step of forming a first layer of a material which substantially reduces light reflection and/or is capable of absorbing light especially in the near infrared region on the face plate adjacent any surface from which off-axis light could be reflected to the photoemissive means and a subsequent step of depositing a second layer of a metallic electrically conductive material on the first layer.

The tube so formed includes a face plate arranged to receive and transmit input light, a photoemissive means for emitting the electrons, and a micro-channel plate for amplifying the emitted electrons. The face plate also includes a surface where off axis input light could be reflected to the photoemissive means and the non-reflective region is formed adjacent at that surface.

BRIEF DESCRIPTION OF THE DRAWINGS

In order to obtain a better understanding of the invention, reference is made to the following detailed description of a preferred embodiment thereof, in which.

DETAILED DESCRIPTION OF THE INVENTION

Figures 1, 2:
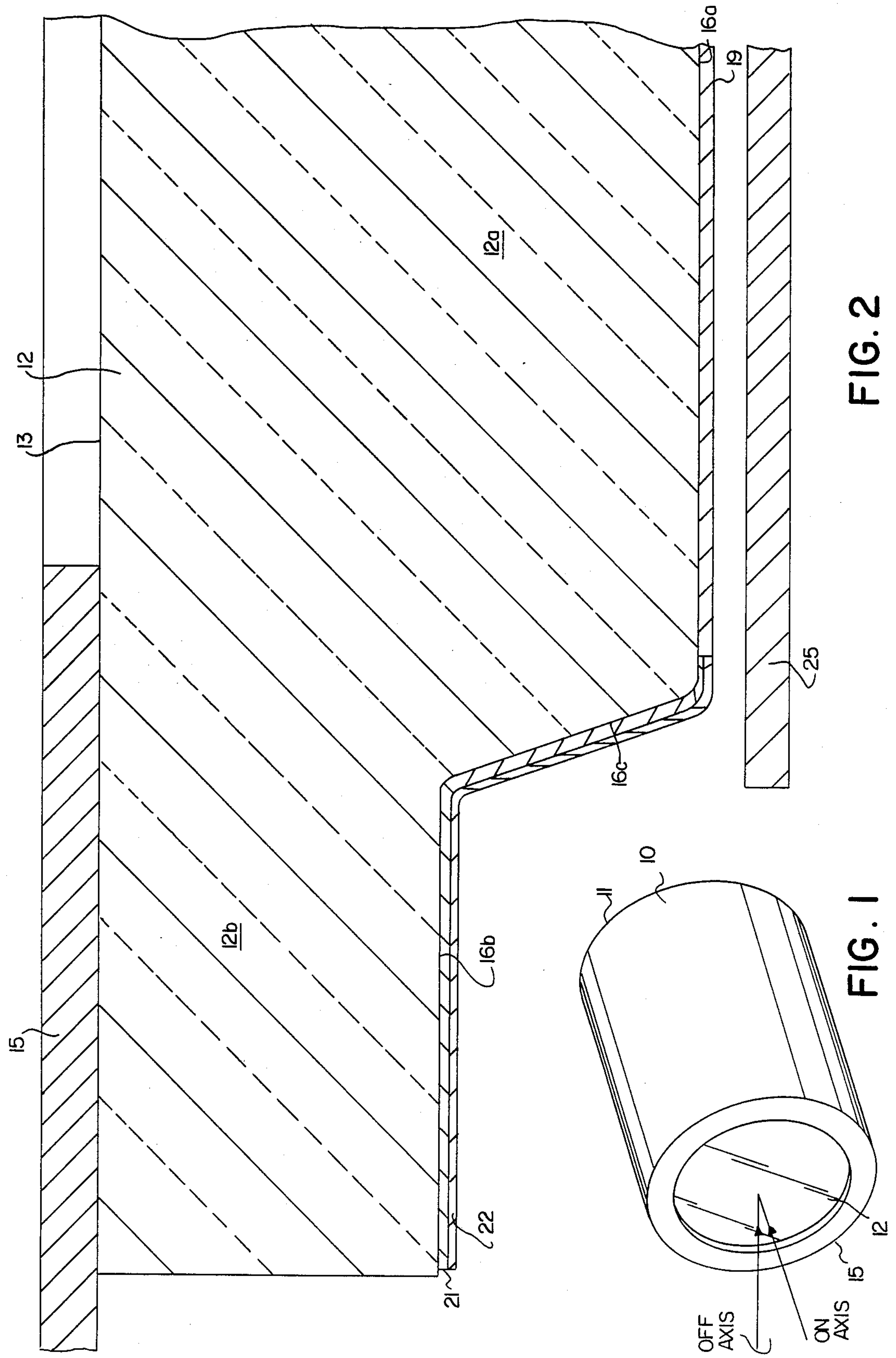
FIG. 1 is a perspective plan view of an image intensifier tube.
FIG. 2 is a cross-sectional view of a glass face plate usable in the image intensifier tube in accordance with this invention; and, FIG. 3 is a partial cross-sectional view of a typical intensifier tube in accordance with this invention.

In FIG. 1, there is shown a simplified perspective view of an image intensifier tube 10. The image intensifier tube 10 includes a cylindrical housing 11 inwhich is located a front face plate 12 made of optical material which is arranged to receive and transmit light. The face plate 12 is normally sealed within the housing 11 and is surrounded by a peripheral flange 15. Light rays from the field of view (labeled on-axis in FIG. 1) penetrate the face plate 12 and are directed to the image intensifier where they are increased in amplitude. In many known arrangements of this type, light which emanates from outside the field of view (labeled off-axis in FIG. 1) is reflected off an inner surface of the tube 10 and is directed back to the intensifier where it is also increased in amplitude. This off-axis light is the source of the veiling glare, as will be made clear hereinafter.

Figure 3:
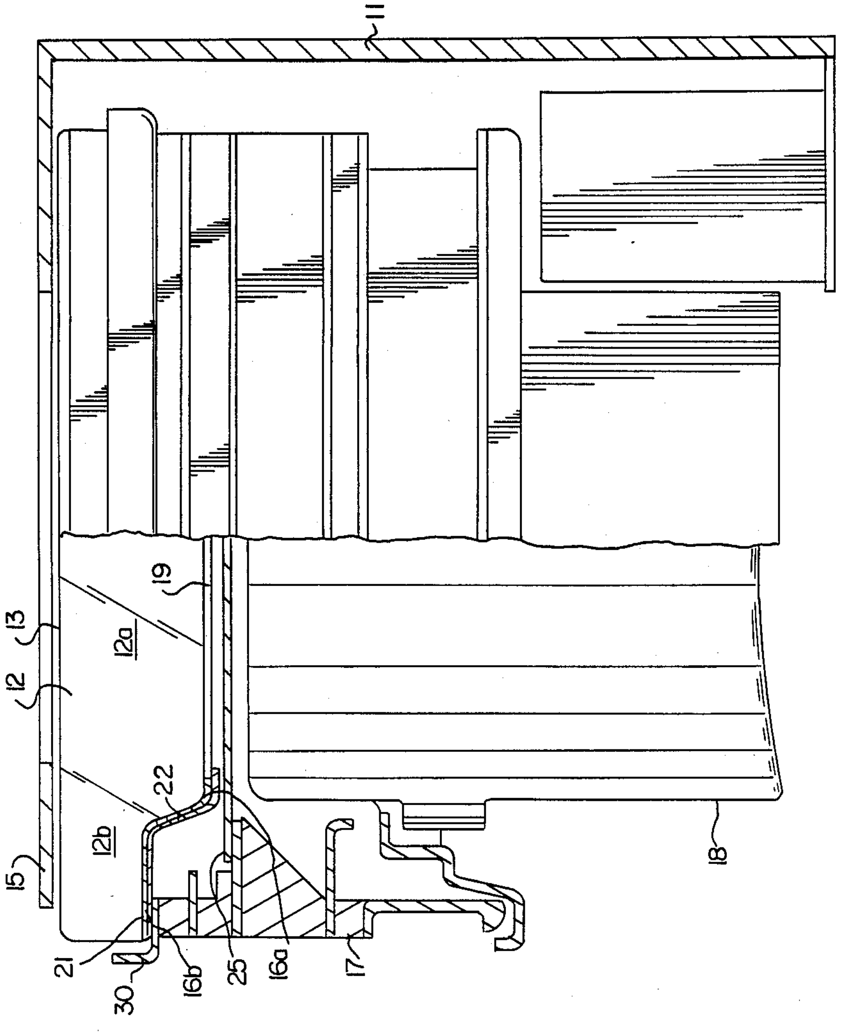

In FIG. 3, the image intensifier tube 10 can be seen to comprise three basic components: the face plate 12 which functions as a cathode; a face plate (inside a chamber 18 and not illustrated in the drawing) which functions as an anode; and a micro-channel plate 25 located in between and spaced from both the face plate 12 and the chamber 18. Both the cathode and anode face plates are preferably formed from glass of high optical quality. The micro-channel plate 25 is also formed of a glass material which possesses a secondary emissive property and conductive characteristics. The micro-channel plate 25 is mounted in the image tube 10 with both its input and output faces parallel to the image tube cathode face plate 12 and a phosphorous screen associated with the anode face plate. The micro-channel plate 25 operates in a well-known manner to amplify photo electrons generated by the input light in order to increase the light output of the tubes.

The face plate 12 can be made of a clear, high quality optical glass such as Corning 7056. This glass comprises 70 percent silica ($SiO_2$), 17 percent boric oxide ($B_2O_3$), 8 percent potash ($K_2O$), 3 percent alumina ($Al_2O_3$) and 1 percent each of soda ($Na_2O$) and lithium oxide ($Li_2O$). Other glasses may, of course, be used instead.

Referring to FIG. 2, the face plate 12 includes a central, generally circular body portion 12a and a reduced thickness sill portion 12b in the form of a flange surrounding the body portion. One surface 13 of the face plate 12 extends continuously across the body and sill portions 12a and 12b, respectively, and the portion of this surface extending over the sill portion 12b and a small adjacent portion of the central body portion 12a fits under the flange 15 and is secured thereto to retain the face plate in the housing 11. The remainder of the portion of surface 13, that is, that portion surrounded by the flange 15 is the exposed surface of the face plate 12 on which input light impinges.

The face plate 12 also includes surface portions 16a and 16b which are generally parallel to the surface 13 and which extend over the body portion 12a and sill portion 12b, respectively. Because of the difference in thickness between the body portion 12a and the sill portion 12b, the surface portions 16a and 16b lie in different planes with the portion 16a being spaced farther from the surface 13 than is the portion 16b. Extending between the surface portions 16a and 16b is a connecting surface portion 16c which, in the embodiment disclosed herein, is generally frusto-conical.

As is usual in the art, the surface portion 16a is covered by a photoemissive wafer 19 formed so that light impinging on the exposed portion of surface 13 and eventually striking the wafer 19 causes the emission of electrons. These electrons are accelerated across a gap by an electric field to the micro-channel plate 25 causing the secondary emission of electrons all in accordance with known principles. The usual photoemissive wafer 19 is a suitable gallium arsenide (GaAs) device, but other suitable materials can be used. In prior devices, a metallic coating is applied to the surfaces 16b, 16c and a portion of 16a in order to establish electrical connection between the wafer 19 and an external power source.

While the heretofore used metallic conductive coatings are satisfactory in many respects, they are in fact a major cause of the veiling glare. Off-axis light impinging on the exposed portion of the surface 13 strikes such metal coating and is reflected back into the central body portion 12a where it impinges on the photoemissive wafer 19 causing the emission of electrons which are accelerated to the micro-channel plate 25 causing secondary emission of electrons. Since the micro-channel plate 25 causes an increase in light output, it actually enhances the undesirable veiling glare.

Reduction in veiling glare is accomplished herein by means of a coating of a material 21 which is applied to the surfaces 16b and 16c and also over a portion of surface 16a adjacent to wafer 19. This coating is formed of a non-reflecting material which is capable of absorbing light especially in the near infrared region. Materials which exhibit these characteristics include metallic oxides. However, in most instances this coating does not conduct electricity. Therefore, a second coating 22 of an electrically conductive metallic material is applied to the coating 21 so that this coating 22 makes contact with the wafer 19 and thus establishes an electrical connection between the wafer 19 and an external biasing power supply (not shown). In a preferred embodiment, the coating 21 is formed of chromium oxide and the coating 22 is formed of elemental chromium.

The coatings 21 and 22 may be applied in any convenient manner. A preferred method of depositing coatings 21 and 22 is by the known process of sputter deposition in which a metallic material electrode is bombarded by positive gas ions and the resulting sputtered particles of the metallic material are deposited onto a surface positioned in the area adjacent the sputtered particles.

This invention has adapted the sputtering technique to deposit the coating 21 of chromium oxide and the coating 22 of chromium on the surfaces 16b, 16c and over a portion of surface 16a which is continuous with 16c. In the herein applied sputtering process, the glass face plate is placed with its surface 13 on a support in a chamber. To deposit the coating 21, the chamber is evacuated to a relatively low pressure and a quantity of oxygen gas mixed with an inert process gas, for example, argon, is introduced into the chamber. Any radio frequency induced plasma sputtering electrode arrangement may be employed. At least one of these electrodes, referred to herein as a target electrode, is positioned in the chamber. The target electrode is made of the elemental material which is to be sputtered. In the preferred embodiment the material of the target electrode is chromium. A radio frequency of approximately 13.56 MHz is applied to the argon and oxygen gas. This produces ionized argon and oxygen atoms whose movement is accelerated by the presence of a potential difference in the chamber. The ionized argon ions bombard the target electrode causing chromium atoms to leave the electrode in a sputtering action. The energy imparted to the argon during ionization is transferred to the chromium atoms. Because of the presence of oxygen gas, the chromium reacts with the oxygen to form chromium oxide which is then deposited on the face plate. The wafer 19 which has already been applied to the surface 16a is shielded during deposition so that it remains free of the coating 21.

After the coating 21 has been deposited, the oxygen in the chamber is evacuated and the argon kept at the level necessary for the sputtering process. The process is then repeated, resulting in a deposition of the second coating 22 which is of the metal oxide in its elemental form, in this embodiment, chromium. This layer is deposited to a thickness of approximately 2000A.

During deposition of the second coating 22, the wafer 19 is again shielded so that it remains free of the coating 22 at most of its surface, but not at its extreme end portions where continuity with the wafer 19 must be established.

It is also possible to gradually reduce the concentration of oxygen after deposition of a sufficient thickness of coating 21 and continue the sputtering process until the material being deposited is solely elemental chromium. In this way a transition layer will be formed and the sputtering process may proceed without interruption.

The resultant coating 21 of chromium oxide acts as the anti-reflective, near infrared light-absorbing coating so that off-axis light received from the light receiving surface 13 is not reflected to the micro-channel plate 25. The resultant coating 22 of elemental chromium provides the electrically conductive connection between the wafer 19 and the external electrical power supply. The coating 21 has a non-reflective, dark appearance while the coating 22 has a silvery, shiny appearance as in standard metallized coatings. The resistance between the photoemissive wafer 19 and the conductive coating 22 is low and is approximately the same as that using a conventional conductive layer. It is the oxygen content of the chromium oxide coating 21 which gives rise to the light-reflecting and near infrared region light-absorbing properties at the interface of the coating 21 and the glass face plate 12, and the absence of oxygen in the metallic coating 22 which provides good electrical conductivity.

Of course, it would also be possible to use metals other than chromium for the coating 21 as long as the metals form oxides which have the desired optical properties and have acceptable electrical conductivity. Moreover, at least in principle, the material of the coating 21 could be different from and not include the material of the coating 22, if so desired or advisable. The coating materials may be selected individually for their desired optical properties and electrical properties and their ability to adhere to the material of the adjoining layer.

Referring to FIG. 3, the image intensifier tube 10 is shown in greater detail. As seen, the flange 15 is part of the cylindrical body 11 and the face plate 12 underlies the flange 15 and is supported at its ends by two "L" shaped members such as 30. The central body portion **12*a* is about 0.22" while the sill 12*b*** is about 0.15".

Located beneath the face plate 12 is the MCP plate 25. Both plates as 12 and 25 are sealed to the tube body 17 by means of conventional supporting structures. The chamber 18 contains the anode fiber optic face plate and the remaining structures forming the image intensifier tube. Essentially, the entire tube from top to bottom is approximately $1\frac{1}{4}''$ in length with a typical diameter of 1.4" and hence as one can ascertain, the entire unit is extremely small.

While in the foregoing, there has been described a preferred embodiment of the invention, it should be understood, that various changes and modifications can be made without departing from the true spirit and scope of the invention.

We claim:

1. A method of making an image intensifier tube comprising the steps of:

forming a face plate of optical material having a light transmitting surface and a light receiving surface positioning photoemissive means adjacent the face plate for emitting electrons in response to light transmitted through the face plate;

depositing a first coating of a metal oxide onto a portion of the light transmitting surface and adjacent the photoemissive means by reactively sputtering a metal, the metal oxide being non-reflecting and light absorbing at least in the near infrared region;

forming a transition layer on the first coating by gradually withdrawing a portion of reactant and increasing the amount of metal in the layer; and withdrawing the remaining reactant to deposit a second coating of an electrically conductive metallic material onto the transition layer and joining the photoemissive means.

2. The method of claim 1 wherein said sputtering includes bombarding a metallic material with ions of argon gas.

3. The method of claim 2 wherein said metal material of chromium.

* * * * *